United States Patent [19]

Isoda et al.

[11] Patent Number: 4,902,555
[45] Date of Patent: Feb. 20, 1990

[54] HYBRID CIRCUIT ELEMENT AND METHOD OF MANUFACTURING THE SAME

[75] Inventors: Satoru Isoda; Osamu Tomisawa; Hiroaki Kawakubo, all of Hyogo, Japan

[73] Assignee: Mitsubishi Denki Kabushiki Kaisha, Tokyo, Japan

[21] Appl. No.: 72,305

[22] Filed: Jul. 13, 1987

[30] Foreign Application Priority Data

Jul. 11, 1986 [JP] Japan .................................. 61-164191
Jul. 11, 1986 [JP] Japan .................................. 61-164198

[51] Int. Cl.$^4$ .................................................. B32B 9/00
[52] U.S. Cl. ........................................ 428/195; 428/212; 428/432; 428/459; 428/478.2; 428/901; 174/260; 361/397; 361/416; 357/8; 357/12; 357/20
[58] Field of Search ............... 428/195, 212, 432, 459, 428/478.2, 901; 174/68.5; 357/81, 12, 20; 361/347, 416

[56] References Cited

U.S. PATENT DOCUMENTS 4,103,064  6/1978  McAlear et al. .
4,613,541  9/1986  Isoda .
4,764,415  8/1988  Isoda et al. ......................... 428/212
4,764,416  8/1988  Ueyama et al. ..................... 428/212

FOREIGN PATENT DOCUMENTS 3600564  12/1985  Fed. Rep. of Germany .

OTHER PUBLICATIONS

J. McAlear et al., EMV Associates, Inc., IEEE Computer Society MEDCOMP 82, Sep. 23–25, 1982.
J. McAlear et al., EMV Associates, Inc., IEE-Japan, App. Phys. Meeting, Sep. 7–11, 1981.

Primary Examiner—Ellis P. Robinson
Assistant Examiner—P. J. Ryan
Attorney, Agent, or Firm—Sughrue, Mion, Zinn, Macpeak & Seas

[57] ABSTRACT

Disclosed herein is a hybrid circuit element including a redox electrial element formed with redox materials such as biomaterials or pseud-biomaterials and a semiconductor element together with the redox electric element. The redox electrical element and the semiconductor element are provided to a common substrate and they are electrically connected to each other with electrical conductors.

6 Claims, 6 Drawing Sheets 4,902,555

HYBRID CIRCUIT ELEMENT AND METHOD OF MANUFACTURING THE SAME

BACKGROUND OF THE INVENTION

1. Field of the Invention

This invention relates to a hybrid circuit element including various redox electrical elements which are formed by using oxidation reduction materials such as redox proteins, and a manufacturing method therefor.

2. Description of the Prior Art

One example of a conventional rectifier element for integrated circuits has a MOS structure as shown in FIG. 1. In FIG. 1, reference numeral 11 designates a p-type silicon substrate 12, an n-type region; 13, a p-type region; 14, an n-type region; 15, $SiO_2$ films; and 16 and 17, electrodes. That is, a p-n junction (the p-type region 13 - the n-type region 14) is formed between the two electrodes 16 and 17, thus showing a rectification characteristic.

The conventional MOS structure rectifier element, being designed as describe above, can be finely machined, and a 256K-bit LSI has been put in practical use which comprises the rectifier elements and transistor elements similar in structure thereto.

In order to increase the memory capacity and the operation speed of an integrated circuit, it is essential to reduce the size of its elements; however, for instance an element using Si has the limitation that, in an extremely fine pattern of the order of 0.2 $\mu$m, the average free path of electrons is substantially equal to the size of the element and the independence of the element can no longer be held. Thus, it can be expected that the silicon technology developing day by day will run into a blank wall when reducing the element size. Therefore, there has been a strong demand for provision of a novel electrical circuit element which can break the technological barrier of 0.2 $\mu$m mentioned above.

Under this circumstance, the present inventors have developed a rectifier element showing a rectification characteristic similar to that of a p-n junction formed by p-type and n-type semiconductors, and a transistor element showing a transistor characteristic similar to that of a p-n-p junction transistor by using electron transfer proteins existing in an organism; i.e., by utilizing the redox potential difference thereof. As a result, it has become possible to make the element size extremely small to a biomolecular level, thereby to permit the high density and high speed operation of circuits. These elements have been described in the specification of U.S. Pat. No. 4,613,541 (or German DE No. 3600564A1).

Furthermore, in order to form a redox electrical element circuit with such elements, elements such as resistors and capacitors which show a high affinity for these elements have been developed. This development has been followed by how to form a circuit with these elements. For this problem, it can be considered that it is possible to form the circuit by using both the redox electrical elements of bio-materials and conventional semiconductor elements.

SUMMARY OF THE INVENTION

In view of the foregoing, an object of this invention is to provide a hybrid circuit elements comprising redox electrical elements and conventional semiconductor elements, and a method for manufacturing the same, and especially its wiring method.

In a hybrid circuit element according to this invention, a redox electrical element formed by using redox materials such as biomaterials or false biomaterials which permit electrons to transfer is combined with semiconductor elements, and these elements are electrically connected with electrical conductors.

In a hybrid circuit element manufacturing method according to the invention, on a layer forming a redox electrical element by using redox materials, a metal wiring pattern is formed by using a mask which is formed through optical exposure using an energy beam, or by directly patterning a metal film according to a CVD (chemical vapor deposition) method.

Figure 1:
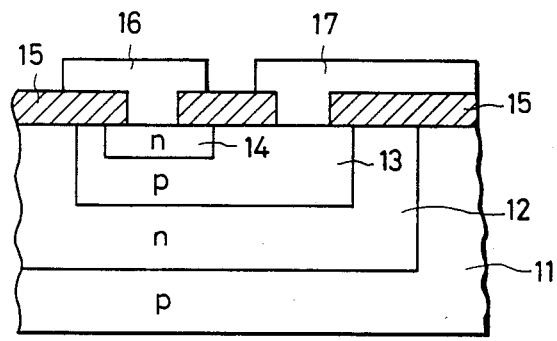
FIG. 1 is an explanatory diagram showing one example of a conventional MOS type rectifier element.
Figure 2A:
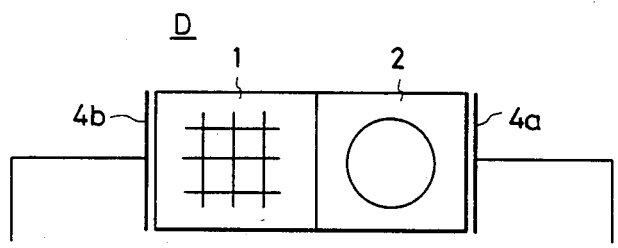
Figure 2B:
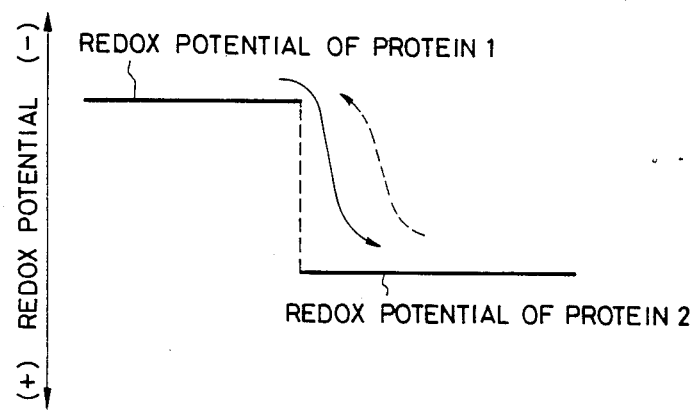
Figure 4:
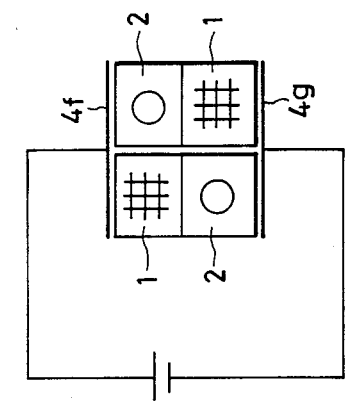
Figure 5:
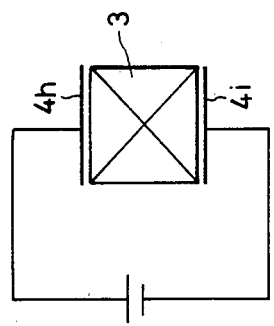
Figure 3A:
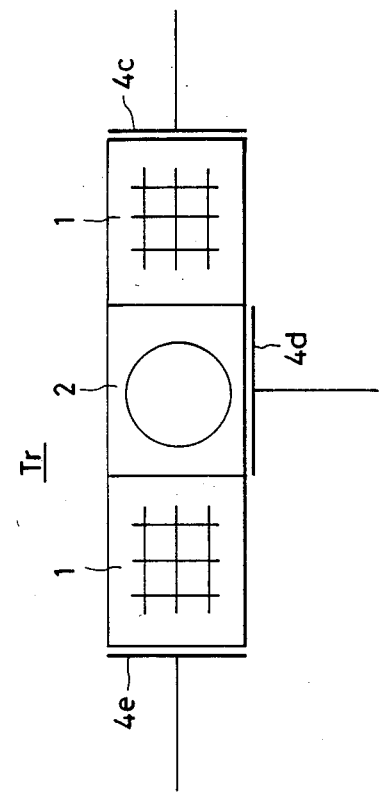
Figure 3B:
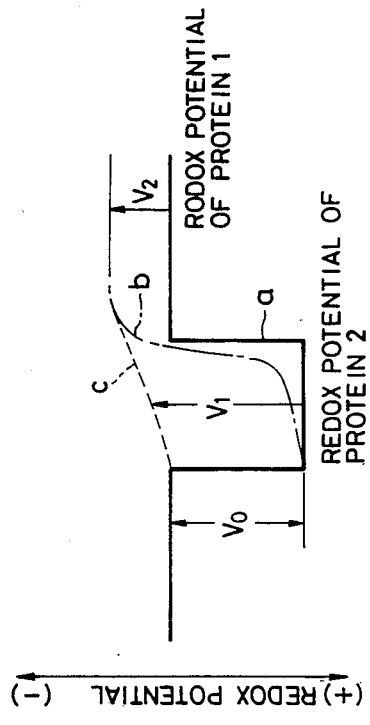
Figure 6:
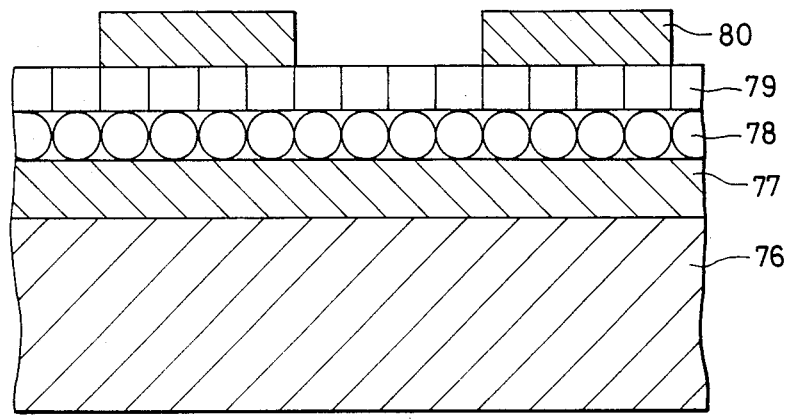
Figure 7:
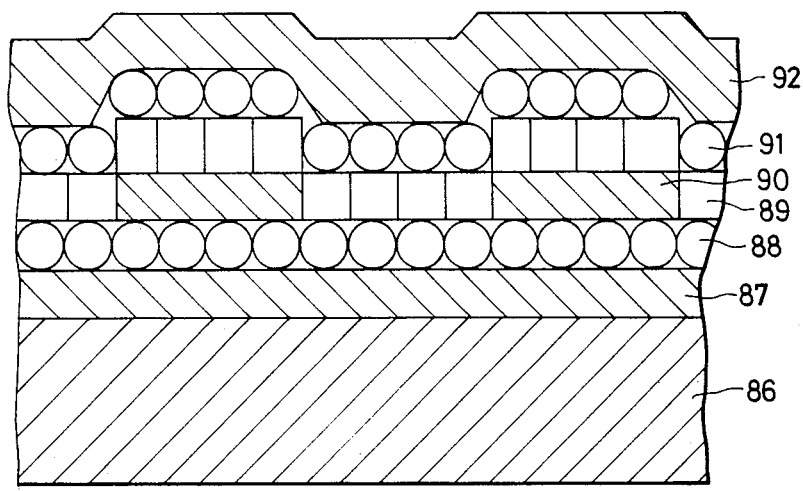
Figure 8A:
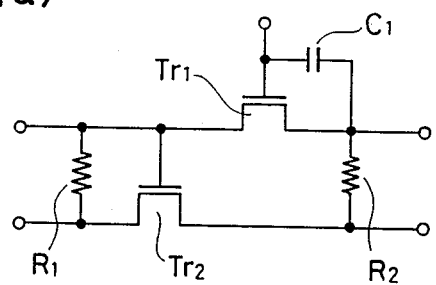
Figure 8B:
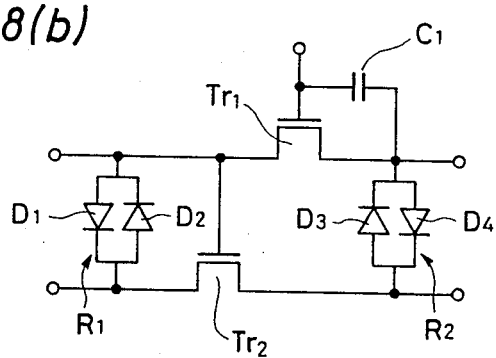
Figure 8C:
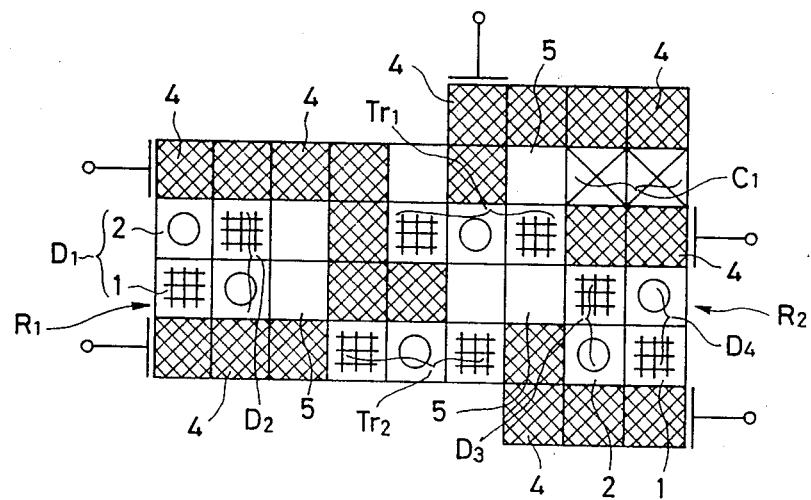
Figure 9:
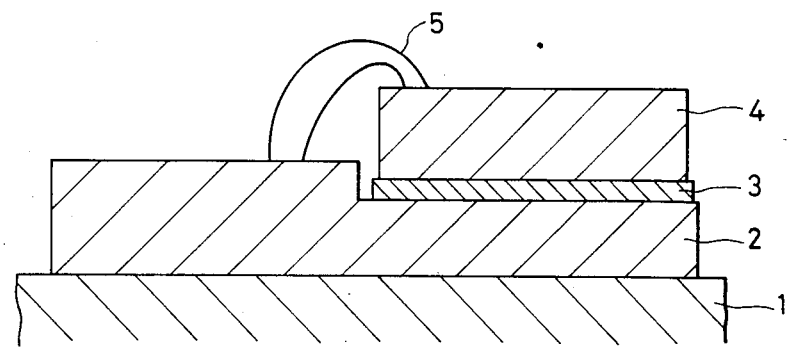
Figure 10:
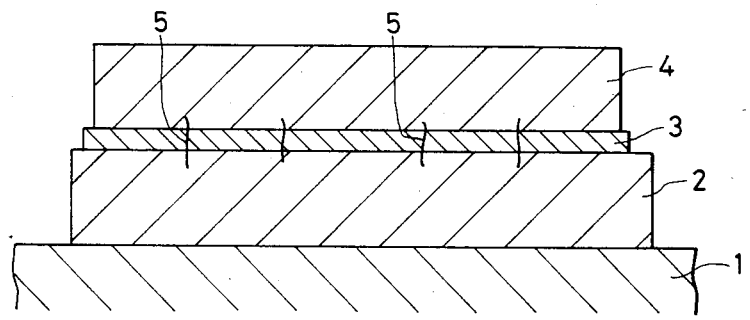
Figure 11:
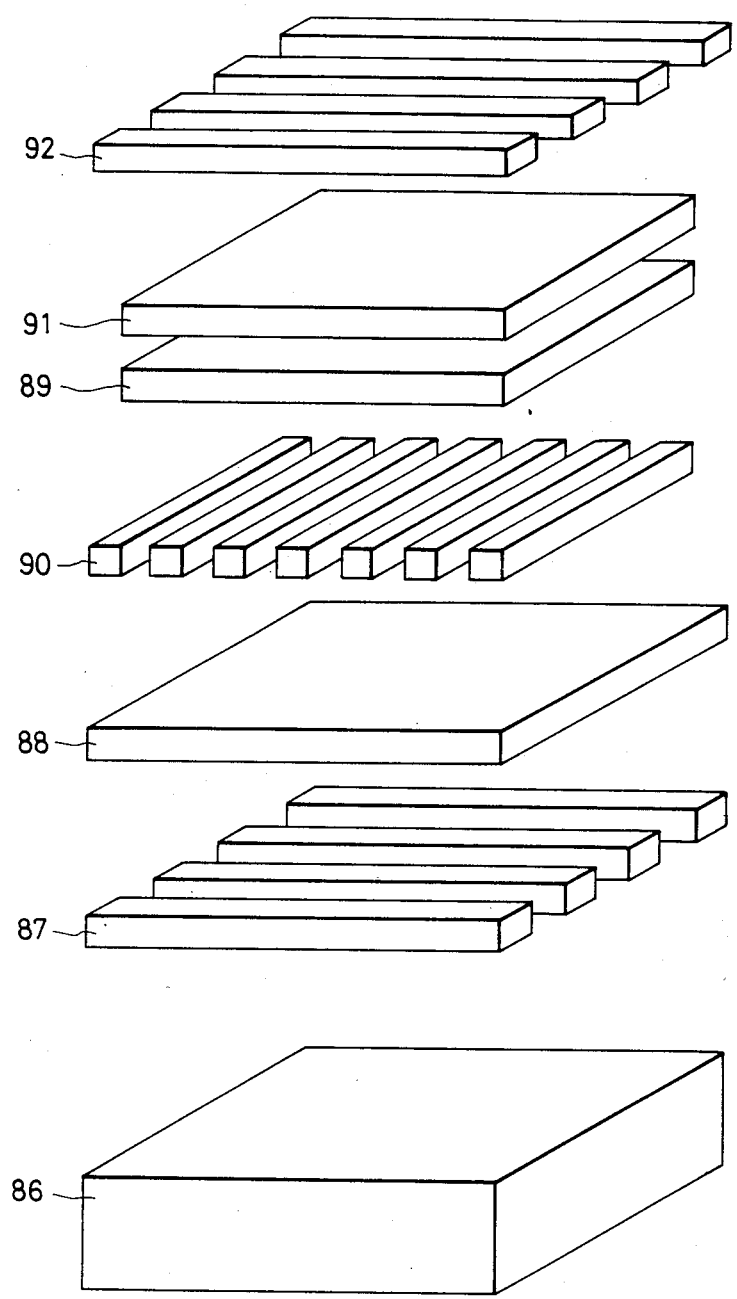

The part (a) of FIG. 2 is an explanatory diagram showing one example of a rectifier element developed by the present inventors, and the part (b) of FIG. 2 is a graphical representation showing the redox potentials of the rectifier element shown in the part (a) of FIG. 2;

FIG. 3 is an explanatory diagram for a description of one example of a switch element developed by the present inventors;

FIG. 4 is an explanatory diagram showing one example of a resistor element developed by the present inventors;

FIG. 5 is an explanatory diagram showing one example of a capacitor developed by the present inventors;

FIG. 6 is a sectional diagram outlining the structure of a device including the rectifier elements developed by the inventors;

FIG. 7 is a sectional diagram illustrating the structure of a device including the switch elements developed by the inventors;

FIG. 8 is a diagram for a description of a monolithic redox electrical element circuit developed by the present inventors;

FIG. 9 and 10 are sectional views illustrating the structures of hybrid circuit elements which are first and second embodiments of the invention, respectively; and FIG. 11 is an exploded perspective view showing the redox electrical element circuit shown in FIG. 7.

DETAILED DESCRIPTION OF THE PREFERRED EMBODIMENTS

Preferred embodiments of this invention will be described with reference to the accompanying drawings.

First, a rectifier element, switch element, resistor element, and a capacitor element, which are redox electrical elements developed by the present inventors, will be described.

In the rectifier element D, as shown in the part (a) of FIG. 2, two kinds of electron transfer proteins different in redox (oxidation reduction) potential namely, for instance a flavodoxin molecule 1 and a cytochrome c molecule 2 are joined together to form a compound, and a pair of electrodes 4a and 4b are connected to the molecules, respectively. In the rectifier element D thus formed, the redox potential of the flavodoxin molecule 1 is different from that of the cytochrome c molecule 2 as shown in the part (b) of FIG. 2, and therefore when a voltage is applied between these molecules, the rectifier element shows the characteristic that electrons flows from negative level to positive level in the redox potential as indicated by a solid line arrow, but they are difficult to flow in the opposite direction as indicated by a broken line arrow. That is, the characteristic of the rectifier element is similar to the rectification characteristic of a p-n junction diode formed by joining an n-type semiconductor and a p-type semiconductor.

The switch element developed by the present inventors, as shown in the past (a) of FIG. 3, comprises: a compound formed by joining flavodoxin molecules 1 to both ends of a cytochrome c molecule 2; and electrodes 4c, 4d and 4e connected respectively to the molecules 1, 2 and 1. In the switch element Tr thus formed, when no voltages are applied to the electrodes 4c, 4d and 4e, its redox potential characteristic is as indicated by the solid line a in the part (b) of FIG. 3. When a negative voltage $V_2$ is applied to the electrode 4c with respect to the electrode 4e, the redox potential characteristic is as indicated by the line b. When, in addition to the voltage $V_2$, a negative voltage $V_1$ is applied to the electrode 4d with respect to the electrode 4e, the redox potential characteristic is as indicated by the line c in the part of (c) of FIG. 3. With the redox potential characteristic a or b, no current flows in the element; but with the redox potential characteristic c, a current flows. Therefore, when, with the voltage $V_2$ applied between the electrodes 4c and 4e, an application of the voltage $V_1$ between the electrodes 4d and 4e is controlled, then a switching characteristic can be given to the element.

The resistor element developed by the present inventors is as shown in FIG. 4. In the resistor element, the above-described compounds (two compounds in the case of FIG. 4) are arranged in anti-parallel connection between a pair of electrodes 4f and 4g. In the resistor element R, the resistance can be adjusted to a desired value by changing the number of compounds.

In the capacitor element C provided by the present inventors, for instance a protein molecule inactive in electron transfer and, high in dielectric constant is employed as a dielectric, and it is sandwiched between a pair of electrodes 4h and 4i.

The actual structure of the above-described rectifier element is as shown in FIG. 6.

In FIG. 6, reference numeral 76 designates a substrate showing a high insulation characteristic; 77, a plurality of metal electrodes of Ag, Au or Al arranged in parallel on the substrate 76; 78, a first electron transfer protein film of cytochrome c molecules which is formed on the substrate 76 according to an LB (LangmuirBlodgett) method or the like; 79, a second electron transfer protein film of flavodoxin molecules which is formed on the first electron transfer protein film 78 according to the LB method or the like; and 80, a plurality of electrodes arranged on the second electron transfer protein film 79 in such a manner that they are perpendicular to the aforementioned electrodes 77. In FIG. 6, the film 78 may be a monomolecular film of organic synthetic molecules formed according to the LB method, and the films 78 and 79 may be a stack of monomolecular films of organic synthetic molecules formed according to the LB method. Furthermore, the film 78 may be a monomolecular film formed by chemical modification; i.e., it may be a monomolecular film formed by chemically modifying the electrode 77 with organic synthetic molecules.

The actual structure of the above-described switch element is as shown in FIG. 7.

In FIG. 7, reference numeral 86 designates a substrate having an insulation characteristics; 87, a plurality of metal electrodes of Ag, Au or Al formed in parallel on the substrate 86; 88, a first electron transfer protein film of flavodoxin molecules formed on the electrodes 87; 90, a plurality of parallel electrodes formed on the first electron transfer protein film 88 in such a manner that they are perpendicular to the electrodes 87; 89, a second electron transfer protein films of cytochrome c molecules formed over the first electron transfer protein film 88 the electrodes 90 by the LB method or the like in such a manner that it is connected to the electrodes 90; 91, a third electron transfer protein film of flavodoxin molecules formed over the second electron transfer protein film 89 by the LB method or the like; and 92, a plurality of parallel electrodes formed over the third electron transfer protein film 91 in such a manner that they are perpendicular to the parallel electrodes 90.

If the above-described various elements are connected with the conductive protein which can transfer electrons in all directions, and the protein which cannot transfer electrons is used as an insulator, then a monolithic redox electrical element using only protein molecules can be provided.

The part (c) of FIG. 8 shows a monolithic circuit element made of protein molecules only whose equivalent circuit is the combination of those of parts (a) and (b) of FIG. 8. That is, the rectifier elements $D_1$ through $D_4$ as shown in FIG. 2, the switch elements $Tr_1$ and $Tr_2$ as shown in FIG. 3, the resistor elements $R_1$ and $R_2$ ($R_1$ consisting of $D_1$ and $D_2$, and $R_2$ consisting of $D_3$ and $D_4$) and the capacitor $C_1$ as shown in FIG. 5 are used, and these elements are connected with the conductive protein molecules 4 which can transfer electrons in all directions while being insulated with insulating protein molecules 5 low in dielectric constant when required. Thus, a high-density high-speed circuit whose size is extremely small to a biomolecular level can be formed.

FIG. 9 shows a hybrid circuit element which is a first embodiment of the invention. In FIG. 9, reference numeral 1 designates a substrate; 2, an Si device layer (generally incorporating an LSI) formed on the substrate 1; 3, an insulating layer of $SiO_2$, $Si_3N_4$ or polyimide formed on a part of the Si device layer 2; and 4, a monolithic redox electrical element circuit as shown, for instance, in FIG. 8. However, this may be an element more simple in arrangement. Further in FIG. 9, reference numeral 5 designates conductors which electrically connect the redox electric element circuit 4 to the Si device layer 2. In the embodiment, the redox electrical element circuit 4 is formed over the insulating layer 3 on the Si device layer 2, and the Si device layer 2 is electrically connected to the redox electrical element circuit 4 through the conductors 5.

In the embodiment described above, the redox electrical element circuit and the Si device layer are combined together on the same substrate. Therefore, the characteristic of the resultant circuit is the combination of the high-density and high speed characteristic of the redox electrical element circuit and the characteristic of the semiconductor element.

FIG. 10 shows a hybrid circuit element which is a second embodiment of the invention. In FIG. 10, parts corresponding functionally to those already described with reference to FIG. 9 are therefore designated by the same reference numerals. In the second embodiment, the redox electrical element circuit 4 is formed on the entire upper surface of the Si device layer 2 over the insulating layer 3, and the redox electrical element circuit 4 is connected to the Si device layer 2 with the conductors extended through the insulating layer 3, so that a multilayer structure including the redox electrical element circuit 4 and the Si device layer 2 is formed. Instead of the Si device layer, a GaAs device layer may be employed.

In the second embodiment, similarly as in the first embodiment, the resultant circuit has the advantages of the two elements, and the degree of integration of the circuit can be increased.

Now, a redox electrical element wiring method, that is, a method for forming electrodes in the redox electrical element will be described with reference to FIG. 11. FIG. 11 is an exploded perspective view showing the structure of the switch element shown in FIG. 7. The metal electrodes 87, 90 and 92 are of metal such as Pt, Ag, Au or Al. The electrodes 87 are arranged in parallel, the electrodes 90 are arranged in parallel, and the electrodes 92 are also arranged in parallel. These electrodes are formed into desired patterns by using masks which have been formed through optical exposure using an energy beam such as visible rays, ultraviolet rays or X-rays. The vacuum deposition of Pt. Au or Al can be achieved at room temperature. For instance, Au is vacuum-deposited to a thickness in a range of from several tens of Angstrom to several hundreds of Angstrom.

These electrodes can be provided in desired wiring patterns according to the CVD (chemical vapor deposition) method using molecular beams, ion beams, X-ray beams or laser beams. In this method, the beam is directly applied to the metal according to a desired pattern, and the electrodes can be formed at temperature lower than 50° C.

The above-described two wiring methods are applicable to the cases of FIGS. 9 and 10 in which the redox electrical element circuit 4 is connected to the Si device layer 2.

As was described above, the metal wiring patterns are formed according to a metal wiring pattern forming method which is the same as that for a semiconductor integrated circuit; i.e., the method of using masks which have been formed through optical exposure using an energy beam, or the method of directly patterning a metal film according to the CVD method using ion beams or laser beams. Therefore, an ultra-high-density ultra-high-speed circuit which is made extremely small in size to a molecular level.

In the above-described embodiments, the electrodes are linear and arranged in parallel. However, modifications are possible without departing from the spirit and scope of appended claims.

In the above-described embodiments, while the electron transfer proteins are employed to form the redox electrical element, electron transfer materials which are psuedo-bio-materials may be employed.

As was described above, the hybrid circuit element is made up of the redox electrical element and the semiconductor element according to the invention. Therefore, the characteristic of the hybrid circuit element according to the invention is the combination of the high-density and high-speed characteristic of the redox electrical element and the characteristic of the semiconductor element.

Furthermore, according to the invention, the metal wiring pattern is formed on the layer forming the redox electrical element by using the mask which has been formed through optical beam exposure, or the wiring conductors are formed by directly patterning the metal film according to the CVD method using molecular beams, ion beams or laser beams. Therefore, a circuit with a redox electrical element can be formed, and the circuit is extremely small in size to a molecular level, according to the invention.

What is claimed is:

1. A hybrid circuit element comprising:
   a substrate;
   a semiconductor device layer formed on at least a portion of said substrate;
   an insulating layer formed on at least a portion of said semiconductor device layer;
   a monolithic redox electrical element comprising redox materials formed on at least a portion of said insulating layer; and
   means electrically connecting said semiconductor device layer and said monolithic redox electrical element.

2. A hybrid circuit element as claimed in claim 1 wherein said redox materials are selected from a group of biomaterials and pseudo-biomaterials which permit electrons to transfer therein.

3. The hybrid circuit element as claimed in. claim 1. wherein said means comprises at least one connector.

4. The hybrid circuit element as claimed in claim 1. wherein said materials comprise a first electron transfer protein having a first redox potential and a second electron transfer protein having a second redox potential different from said first redox potential.

5. The hybrid circuit element as claimed in claim 1. wherein said redox element is formed on the entire surface of said insulating layer.

6. The hybrid circuit element as claimed in claim 5 wherein said means comprises a plurality of conductors extending through said insulating layer.

* * * * *